(12) United States Patent
Ohuchi

(10) Patent No.: US 6,498,374 B1
(45) Date of Patent: Dec. 24, 2002

(54) MOS SEMICONDUCTOR DEVICE HAVING GATE INSULATING FILM CONTAINING NITROGEN

(75) Inventor: Kazuya Ohuchi, Kanagawa-ken (JP)

(73) Assignee: Kabushiki Kaisha Toshiba, Kawasaki (JP)

( * ) Notice: Subject to any disclaimer, the term of this patent is extended or adjusted under 35 U.S.C. 154(b) by 0 days.

(21) Appl. No.: 09/609,314

(22) Filed: Jun. 30, 2000

(30) Foreign Application Priority Data

Jul. 1, 1999 (JP) ............................................ 11-187970

(51) Int. Cl.⁷ ............................................... H01L 29/78
(52) U.S. Cl. ........................ 257/368; 257/639; 257/405; 257/410
(58) Field of Search ................................ 257/405, 409, 257/410, 411, 368, 639, 649

(56) References Cited

U.S. PATENT DOCUMENTS 6,069,041 A * 5/2000 Tanigami et al. ............ 438/261

FOREIGN PATENT DOCUMENTS

| JP | 07030113 A | * | 1/1995 |
| JP | 9-312393 | | 12/1997 |
| JP | 10-163348 | | 6/1998 |

* cited by examiner

Primary Examiner—Minh Loan Tran
Assistant Examiner—Thomas Dickey
(74) Attorney, Agent, or Firm—Foley & Lardner

(57) ABSTRACT

Disclosed is a MOS semiconductor device, which comprises a semiconductor substrate; a gate insulating film formed on the semiconductor substrate, the gate insulating film containing nitrogen; a gate electrode selectively formed on the gate insulating film; and an oxide film formed on a surface of the gate electrode and the semiconductor substrate, wherein a thickness of a first portion of the gate insulating film which overlaps vertically the gate electrode is one third or less that of a second portion of the gate insulating film disposed at a corner portion of the gate electrode.

According to such constitution of the MOS transistor device of the present invention, by allowing the gate insulating film to contain nitrogen, an increase in a thickness of the gate insulating film toward the semiconductor substrate than required can be suppressed, and hence lowering of a gate voltage can be prevented, resulting in preventing a controllability deterioration of the MOS transistor device.

8 Claims, 11 Drawing Sheets

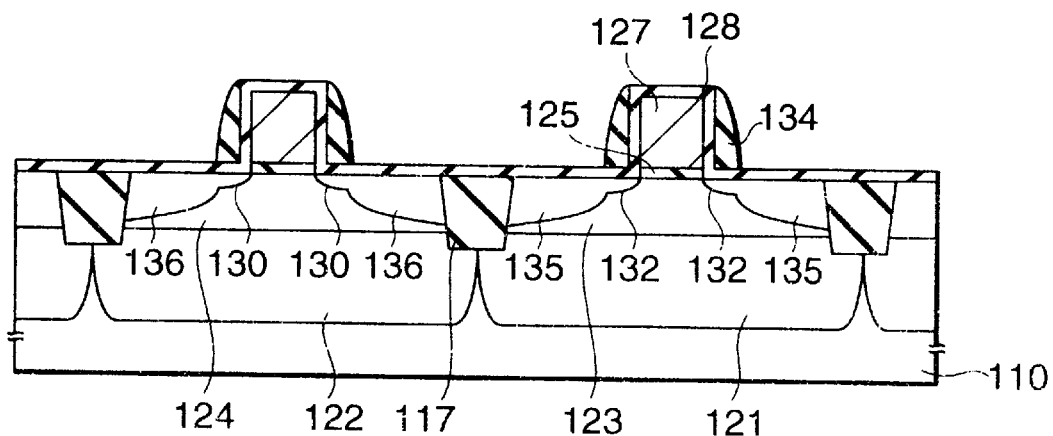
Fig. 1-A PRIOR ART
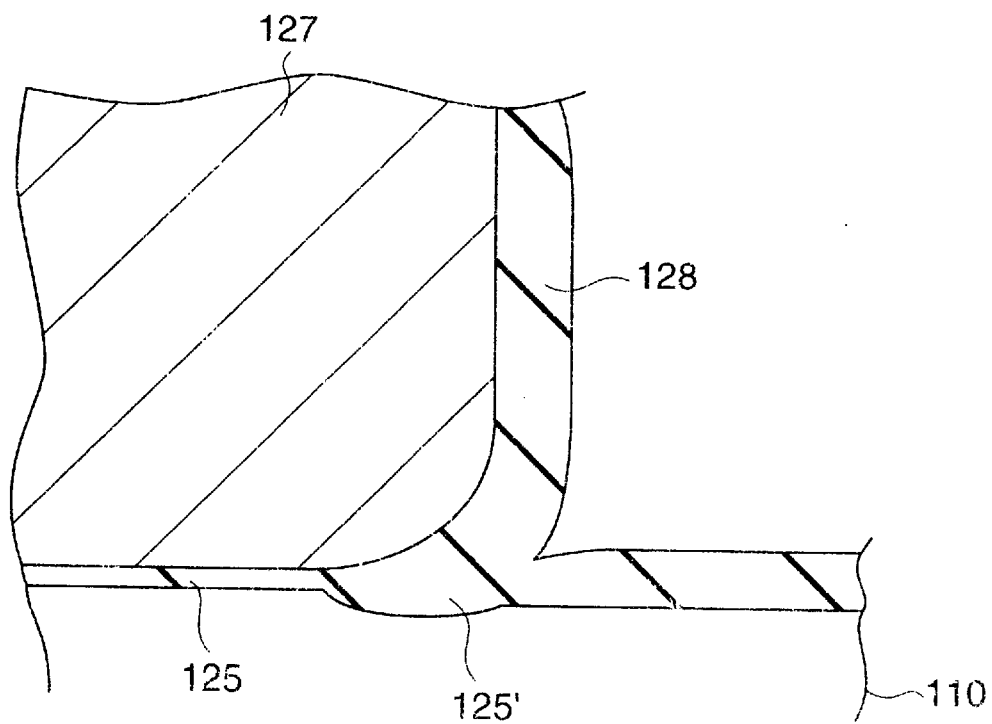
Fig. 1-B PRIOR ART

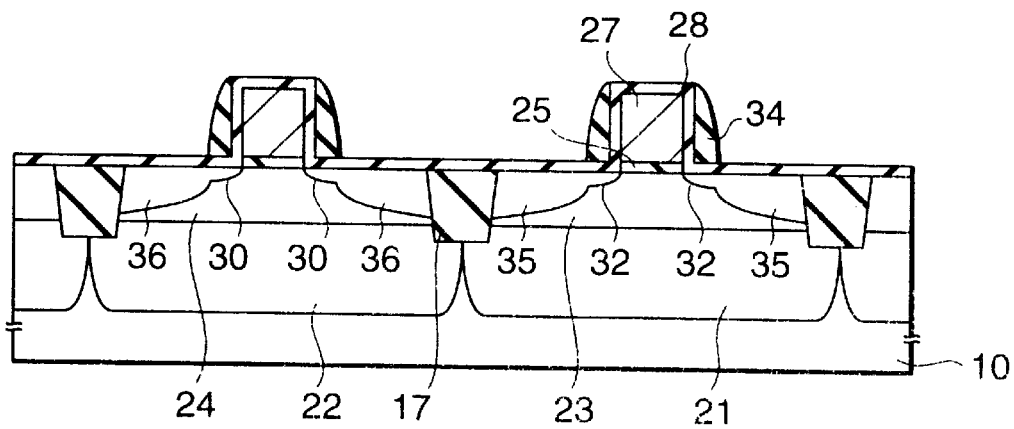
Fig. 2-A
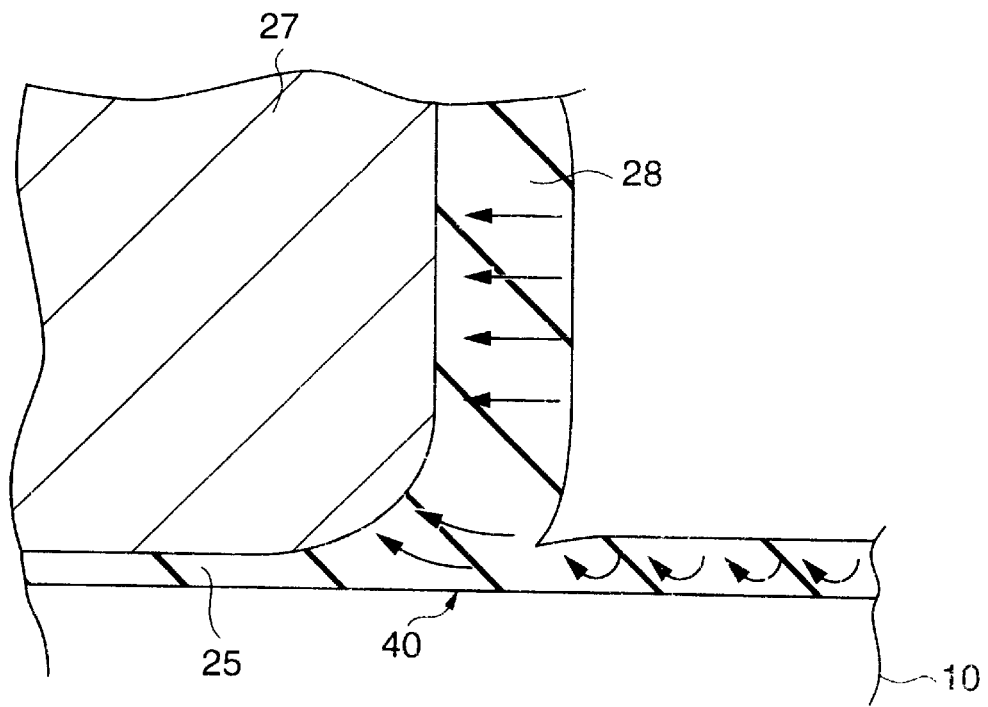
Fig. 2-B

MOS SEMICONDUCTOR DEVICE HAVING GATE INSULATING FILM CONTAINING NITROGEN

FIELD OF THE INVENTION

The present invention relates to a MOS semiconductor device in which a post oxide film is formed on a surface of a gate electrode and a semiconductor substrate.

BACKGROUND OF THE INVENTION

As a method to prevent deterioration in a withstand voltage of a gate insulating film of a silicon MOS FET, there has been heretofore a technology called post oxidation. A post oxide film means an oxide film formed on a surface of a gate electrode and a semiconductor substrate in order to protect a gate insulating film in a corner portion of the gate electrode. An outline of a MOS semiconductor device in which a post oxide film is formed is shown in FIG. 1-A. A post oxide film 128 is formed on a gate electrode 127, an n-type diffusion layer 135, and a p-type diffusion layer 136.

FIG. 1-B is a section view showing a structure after performing a post oxidation in the manufacturing steps of the MOS semiconductor device, which shows a corner portion of the gate electrode 127. As shown in FIG. 18, the gate insulating film 125 is formed on a silicon substrate 110, and a gate electrode (polysilicon gate electrode) 127 formed of polysilicon is selectively formed on the gate insulating film 125. Thereafter, a post oxidation is conducted, and then a gate post oxide film 128 is formed on the gate electrode 127 and the semiconductor substrate 110.

In the post oxidation steps for forming such a gate oxide film, also the gate electrode 127 is oxidized together with the silicon substrate 110, and hence a thickness of an oxide film in a corner portion of the gate electrode 127 is increased. Accordingly, the radius of curvature of the corner portion of the gate electrode 127 becomes large, and an electric field concentration at a corner portion of a gate electrode of a MOS transistor can be avoided.

Furthermore, it is possible to prevent a deterioration of a gate insulating film at the corner portion of the gate electrode in manufacturing steps of the MOS transistor.

However, in the step for forming the gate post oxide film 128, the silicon substrate 110 is also oxidized together with polysilicon forming the gate electrode 127, and an oxide film 125 having a larger thickness than required is formed in the corner portion of the gate electrode 127. Thus, because an apparent thickness of the gate electrode oxide film 125 is large, a voltage applied to the gate oxide film 125 is weakened, and a gate voltage is lowered, resulting in deterioration of controllability of the MOS transistor. When the MOS transistor is operated in this state, an absolute value of the threshold voltage at the microfabricated channel region is substantially lowered. For this reason, an off leak current flowing in turning off the MOS transistor may increase.

To form an extension diffusion layer 132 of a source/drain electrode, the post oxide film 128 is used as a protection oxide film in ion implantation. In this case, impurity ions are taken into the post oxide film 128, and hence a dose of impurities implanted into the silicon substrate 110 is reduced. Moreover, for the foregoing reason, ion implantation must be performed in consideration of a thickness of the gate -post oxide film, and the implanted ions create a wide impurity distribution. Accordingly, it is impossible to form a precise impurity concentration profile.

SUMMARY OF THE INVENTION

One object of the present invention is to provide a semiconductor device and a manufacturing method for the same, which are capable of suppressing occurrence of a leak current at a corner portion of a gate electrode, and suppressing a reduction in a dose of impurities implanted into a substrate in ion implantation in forming a source/drain diffusion layer.

A semiconductor device of the present invention has the following constitution to achieve the foregoing and other objects.

The semiconductor device of the present invention comprises a semiconductor substrate; a gate insulating film formed on the semiconductor substrate, the gate insulating film containing nitrogen; a gate electrode selectively formed on said gate insulating film; and an oxide film formed on a surface of the gate electrode and the semiconductor substrate, wherein a thickness of a portion of the gate insulating film closer to the semiconductor substrate is one third or less of that of the gate insulating film closer to a corner portion of the gate electrode.

The gate insulating film is allowed to contain nitrogen, so that an increase in a thickness of the gate insulating film at the corner portion of the gate electrode can be controlled. Thus, it is possible to prevent lowering of a gate voltage.

Furthermore, in the semiconductor device of the present invention, the gate insulating film formed under the gate electrode is an oxide film containing nitrogen at a concentration ranging from about 2% to 10%.

By setting the nitrogen concentration at the foregoing range, a dielectric constant of the gate insulating film is lowered, and hence a reduction in a source-drain current can be prevented.

Still furthermore, in the semiconductor device of the present invention, the gate insulating film has a nitrogen concentration, a peak of which is positioned in the vicinity of the surface of the semiconductor substrate.

Since the peak position of the nitrogen concentration is located in the surface of the semiconductor substrate, oxidation dose not proceed toward the semiconductor substrate, while allowing oxidation dose proceed toward the side surface of the gate electrode.

A manufacturing method of the present invention comprises the steps of: forming a gate insulating film on a semiconductor substrate, the gate insulating film containing nitrogen; forming a gate electrode selectively on the gate insulating film; and performing a post oxidation after forming the gate electrode to form an oxide film on a surface of the gate electrode and the semiconductor substrate.

By permitting the gate insulating film to contain nitrogen, it is possible to suppress an increase in the thickness of the gate insulating film beyond that required, and it is also possible to prevent lowering of the gate voltage while, improving the controllability of the MOS transistor.

Furthermore, in the manufacturing method of the present invention, a thickness of a portion of the gate insulating film closer to the semiconductor substrate is one third or less of a thickness of a portion of the gate insulating film closer to a corner portion of the gate electrode.

Still furthermore, in the manufacturing method of the present invention, the gate insulating film just under the gate electrode is an oxide film containing nitrogen at a concentration ranging from about 2% to 10%.

Still furthermore, in the manufacturing method of the present invention, the gate insulating film has a nitrogen concentration, a peak of which is located in the vicinity of the surface of the semiconductor substrate.

Since a peak position of a nitrogen concentration is located in the surface of the semiconductor substrate, oxidation which is about to proceed toward the semiconductor substrate can be stopped, while allowing oxidation to proceed toward the side surface of the gate electrode.

Other objects, features, and advantages of the present invention will become apparent from the following detailed description. It should be understood, however, that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

A more complete appreciation of the present invention and many of its. attendant advantages will be readily obtained by reference to the following detailed description considered in connection with the accompanying drawings, in which;

FIG. 1-A is a section view showing. a conventional MOS semiconductor device having a gate post oxide film;

FIG. 1-B is a partially enlarged section view showing a corner portion of a gate electrode of the MOS semiconductor device shown in FIG. 1-A;

FIG. 2-A is a section view showing a MOS semiconductor device having a gate post oxide film according to the present invention;

FIG. 2-B is a partially enlarged section view showing a corner portion of a gate electrode of the MOS semiconductor device shown in FIG. 2-A;

DETAILED DESCRIPTION OF THE PREFERRED EMBODIMENTS

Figure 3:
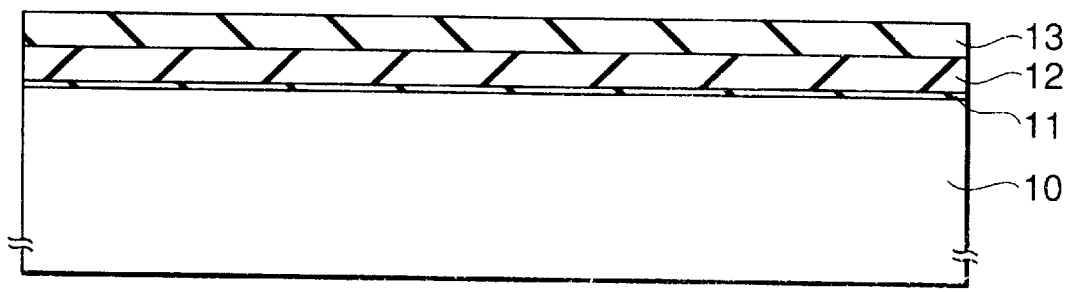
FIG. 3 is a section view showing a manufacturing step of the semiconductor device according to the present invention.

An embodiment of a semiconductor device of the present invention and a manufacturing method of the same will be described with reference to the accompanying drawings below.

As a method to prevent deterioration in a withstand voltage of a gate insulating film of a MOS semiconductor device, there has been a technique called the post. oxidation. A post oxidation film is an oxide film formed on a surface of a gate electrode and a semiconductor substrate in order to protect a gate insulating film located at a corner portion of the gate electrode. An outline of the MOS semiconductor device in which a gate post oxide film (hereinafter referred to as a post oxide film 28) is formed is shown in FIG. 2-A.

A n-type diffusion layer 35 and a p-type diffusion layer 36 are formed in a semiconductor substrate 10, and a gate oxide film 25 and a gate electrode 27 are formed on a surface of the semiconductor substrate 10. The gate oxide film 25 contains nitrogen at a concentration ranging from about 2% to 10%. A post oxide film 28 is formed on a surface of the gate electrode 27, the n-type diffusion layer 35 and the p-type diffusion layer 36.

FIG. 2-B is a section view showing a structure after performing the post oxidation in manufacturing steps of a MOS transistor, and a corner portion of a gate electrode 27 is illustrated in detail therein. As shown in FIG. 2-B, a gate insulating film 25 is formed on a semiconductor (silicon) substrate 10, and a gate electrode (polysilicon gate electrode) 27 made of polysilicon is selectively formed on the gate insulating film 25. Thereafter, the gate electrode 27 and a surface of the semiconductor substrate 10 is oxidized, thus forming an oxide film 28 on the gate electrode 27 and the semiconductor substrate 10.

In the post oxidizing step for forming the post oxide film 28, also the gate electrode 27 formed of polysilicon is oxidized together with the semiconductor substrate 10, and a thickness of the oxide film close to a corner portion of the gate electrode 27 is increased resulting in warping of the oxide film close to the corner portion of the gate electrode 27. Accordingly, the radius of curvature at the corner portion of the gate electrode 27 becomes larger, and hence electric field concentration at the corner portion of the gate electrode of the MOS transistor can be prevented.

The manufacturing method of the semiconductor device of the present invention will be described in accordance with the order of the manufacturing steps in detail. FIGS. 3 to 6 are section views showing manufacturing steps for forming an element isolation region of the semiconductor device of the present invention.

As shown in FIG. 3, a silicon oxide film 11 is first formed on a semiconductor substrate 10, and a silicon nitride film 12 is formed on the silicon oxide film 11. A silicon oxide film 13 is formed on the silicon nitride film 12.

Figure 4:
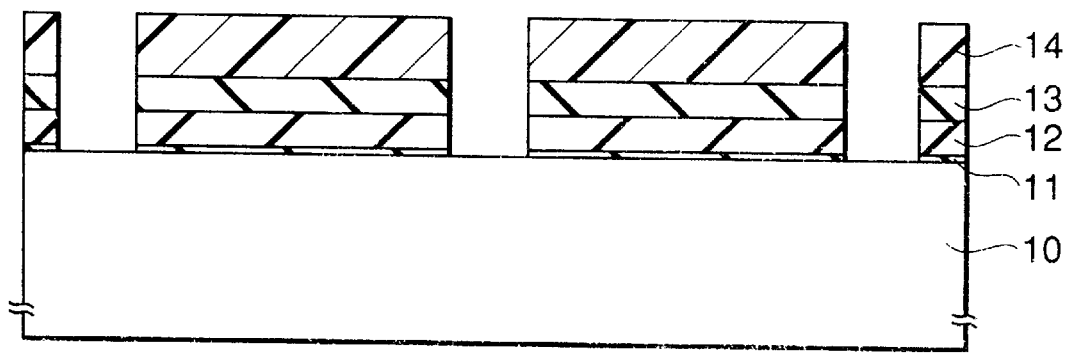
FIG. 4 is a section view showing a manufacturing step of the semiconductor device subsequent to that of FIG. 3.

Next, as shown in FIG. 4, a patterned photoresist film 14 is formed on the silicon oxide film 13. The silicon oxide films 11 and 13 and the silicon nitride film 12 are selectively removed using the photoresist film 14 as a mask. Thereafter, the photoresist film 14 is removed.

Figure 5:
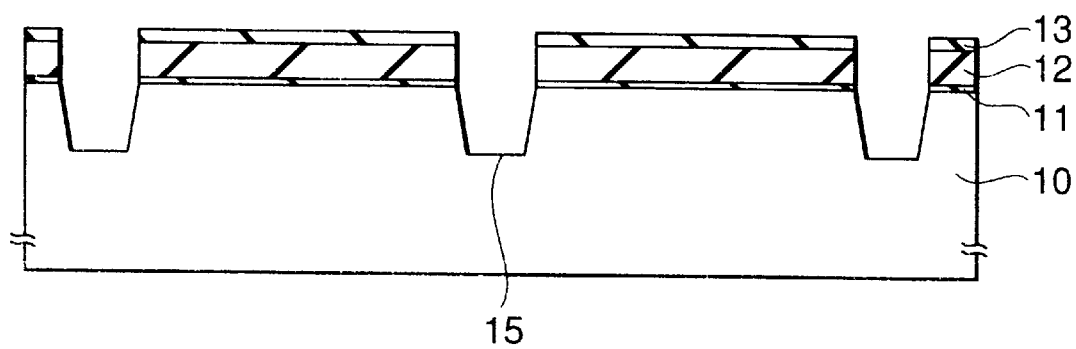
FIG. 5 is a section view showing a manufacturing step of the semiconductor device subsequent to that of FIG. 4.

Next, as shown in FIG. 5, the portion of the semiconductor substrate 10 corresponding to the element isolation region is removed by a reactive ion etching (RIE) using the silicon oxide films 11 and 13 and the silicon nitride film 12 as a mask, thus forming a trench 15 in the semiconductor substrate 10.

Figure 6:
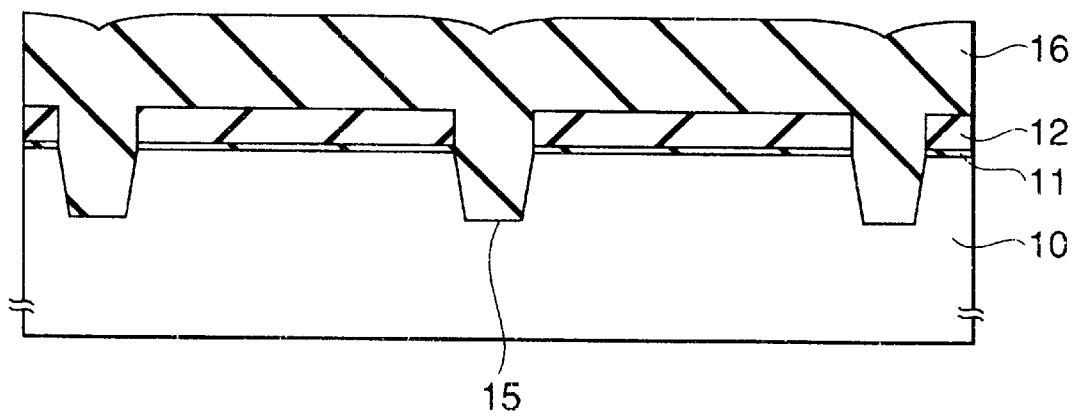
FIG. 6 is a section view showing a manufacturing step of the semiconductor device subsequent to that of FIG. 5.

Subsequently, as shown in FIG. 6, a silicon oxide film 16 is formed on the entire surface of the resultant structure so as to fill the trench 15 with the silicon oxide film 16.

Figure 7:
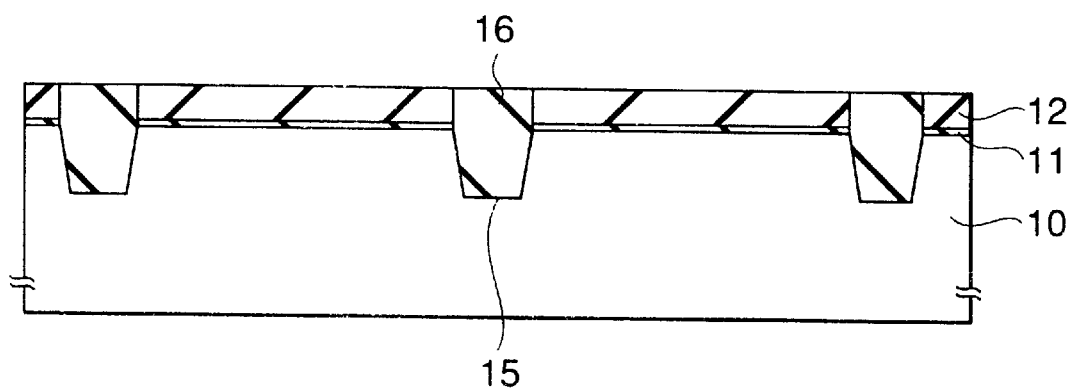
FIG. 7 is a section view showing a manufacturing step of the semiconductor device subsequent to that of FIG. 6.

Next, as shown in FIG. 7, the silicon oxide film 16 is flattened by a chemical mechanical polishing (CMP) method, and polished until the surface of the silicon nitride film 12 is exposed.

Next, the silicon oxide films 11 and 16 and the silicon nitride film 12 are removed by wet etching, thus exposing the surface of the semiconductor substrate 10.

Figure 8:
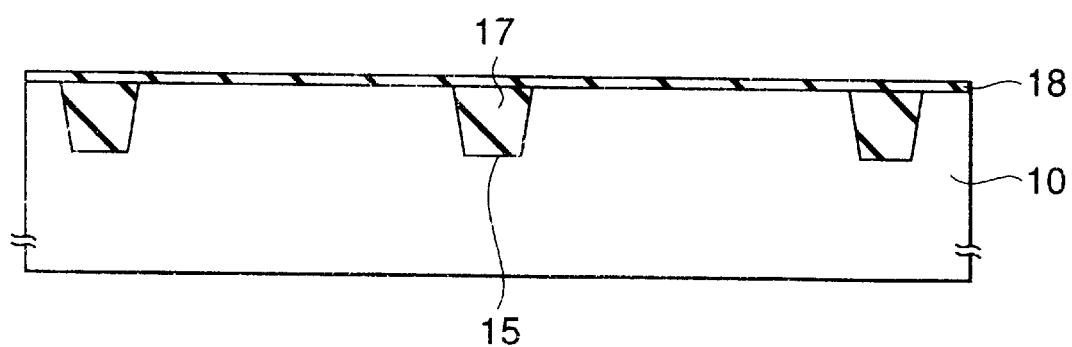
FIG. 8 is a section view showing a manufacturing step of the semiconductor device subsequent to that of FIG. 7.

With such processing, the element isolation region 17 is formed in the semiconductor substrate 10 as shown in FIG. 8, and thereafter a silicon oxide film 18 is formed on the entire surface of the resultant structure.

FIGS. 9 to 15 are section views showing formation steps of the gate electrode.

Figure 9:
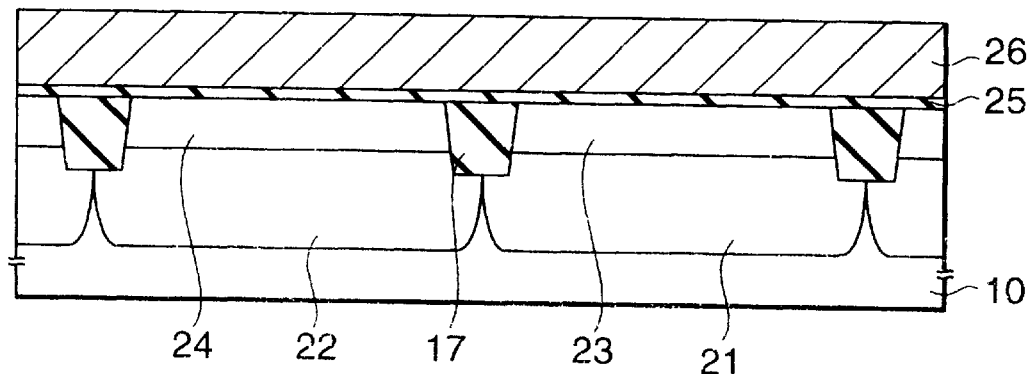
FIG. 9 is a section view showing a manufacturing step of the semiconductor device subsequent to that of FIG. 8.

As shown in FIG. 9, a photoresist film (not shown) patterned is first formed on a semiconductor substrate 10. Ion implantation and diffusion are performed using the photoresist film as a mask, and a P type well 21 is formed in the surface of the semiconductor substrate 10. Thereafter, the photoresist film is removed. In the same manner as that as described above, a patterned photoresist film (not shown) is formed above the P type well 21. Ion implantation and diffusion are performed using the photoresist film as a mask, and an N type well 22 is formed in the surface of the semiconductor substrate 10. Thereafter, the photoresist film is removed. Subsequently, an n-channel region 23 and a p-channel region 24 are formed in the surfaces of the P and N type wells 21 and 22 in the semiconductor substrate 10, respectively. Then, the silicon oxide film 18 is removed. Next, a gate insulating film 25 is formed on the semiconductor substrate 10. In forming the gate insulating film 25, oxidizing/nitriding reaction is performed using single gas or mixture gas composed of oxygen and nitrogen containing any of NO, $N_2O$ and $NH_3$. Accordingly, a gate insulating film 25 formed of a silicon oxide film containing nitrogen at a concentration ranging from about 2% to 10% is formed. Note that a method for forming the gate oxide film 25 and a high concentration region is not limited to the above. For example, the gate insulating film 25 may be formed in such manner that a silicon oxide film as a base is formed and then the silicon oxide film is nitrided by gas containing any of the foregoing NO, $N_2$ and $NH_3$.

Subsequently, a polysilicon film 26 is formed on the gate insulating film 25.

Figure 10:
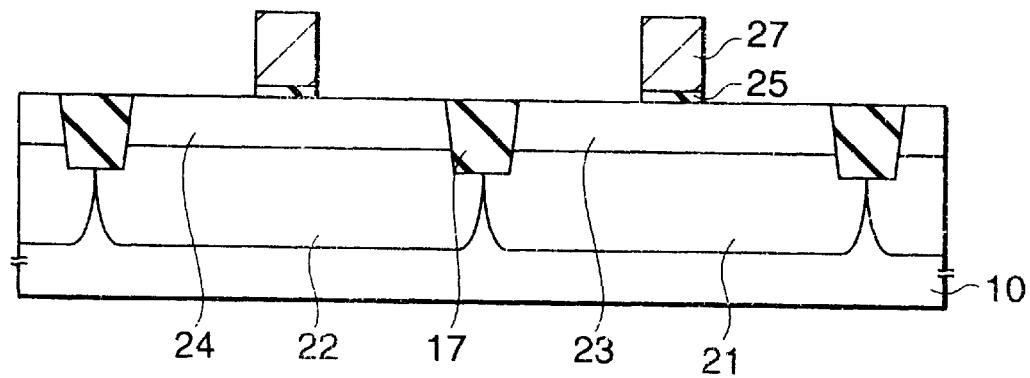
FIG. 10 is a section view showing a manufacturing step of the semiconductor device subsequent to that of FIG. 9.

Next, a photoresist film (not shown) patterned is formed on the polysilicon film 26. Thereafter, as shown in FIG. 10, the polysilicon film 26 and the gate insulating film 25 are selectively removed by RIE using the photoresist film as a mask. As a result, a polysilicon gate electrode 27 is formed.

Figure 11:
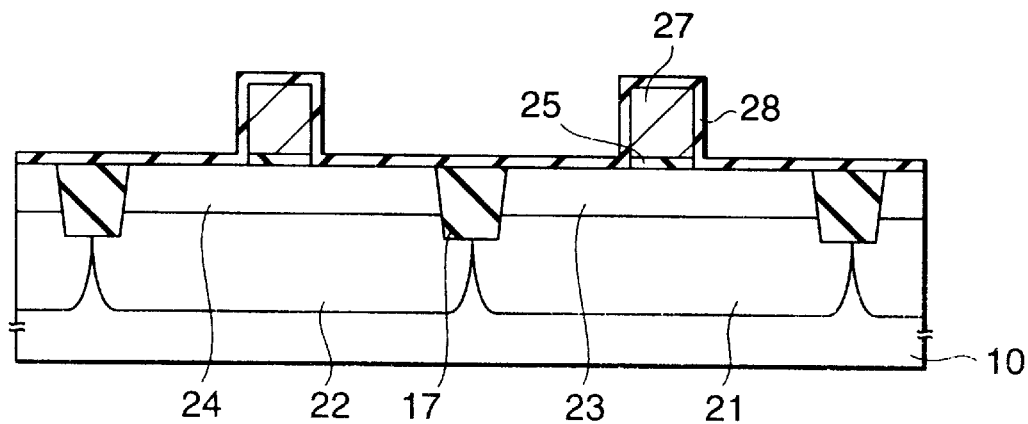
FIG. 11 is a section view showing a manufacturing step of the semiconductor device subsequent to that of FIG. 10.

Subsequently, as shown in FIG. 11, the polysilicon gate electrode 27 and the surface of the semiconductor substrate 10 are post-oxidized by an atmosphere, thus forming a gate post oxide film 28 on the entire surface of the resultant structure.

The gate insulating film 25 contains nitrogen, and a nitrogen concentration at the surface of the gate insulating film 25 in contact with the semiconductor substrate 10 shows the highest level. Since nitrogen shows a molecular bond stronger than that of oxygen, oxidation of silicon is suppressed.

For this reason, although the gate electrode 27 is oxidized, oxidation in the vicinity of the surface of the semiconductor substrate 10 is suppressed, and hence growth of the gate post oxide film 28 the semiconductor substrate 10 is controlled toward. On the contrary, the surface of the polysilicon gate electrode 27 and the surface of the diffusion layer 32 are more oxidized than the semiconductor substrate 10 below the gate electrode 27.

For example, when oxidation is conducted by annealing under conditions that a temperature is 800° C. and a treatment time is 30 minutes, the semiconductor substrate 10 is oxidized by about 6 nm in case where the gate oxide film contains no nitrogen. On the other hand, in the semiconductor device having the gate insulating film 25 of a thickness of 3.5 nm, which contains nitrogen at a concentration of about 2%, the semiconductor substrate 10 is oxidized by only about 1 nm.

Figure 12:
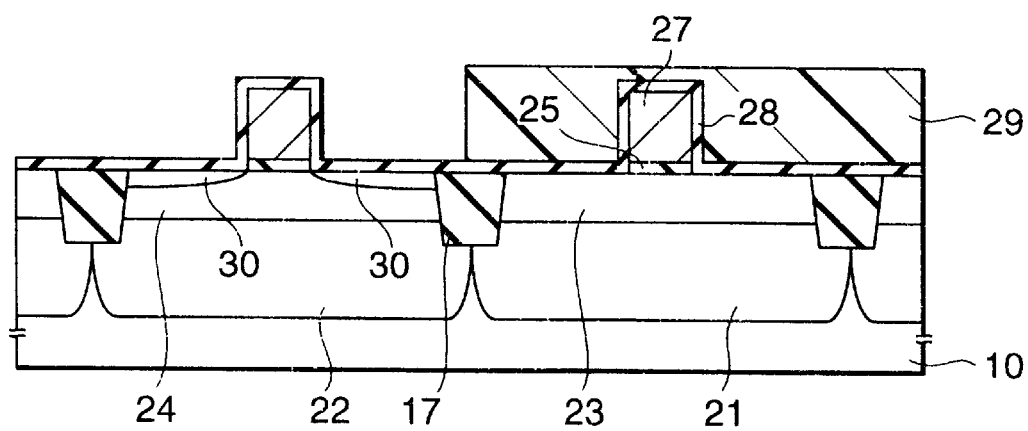
FIG. 12 is a section view showing a manufacturing step of the semiconductor device subsequent to that of FIG. 11.

Next, as shown in FIG. 12, a patterned photoresist film 29 is formed above the P-well 21. Impurities are directed at the surface of the semiconductor substrate 10 using the photoresist film 29 as a mask, thus forming a P type extension region 30 in the surface of the semiconductor substrate 10 corresponding to the N well 22. Thereafter, the photoresist film 29 is removed.

Figure 13:
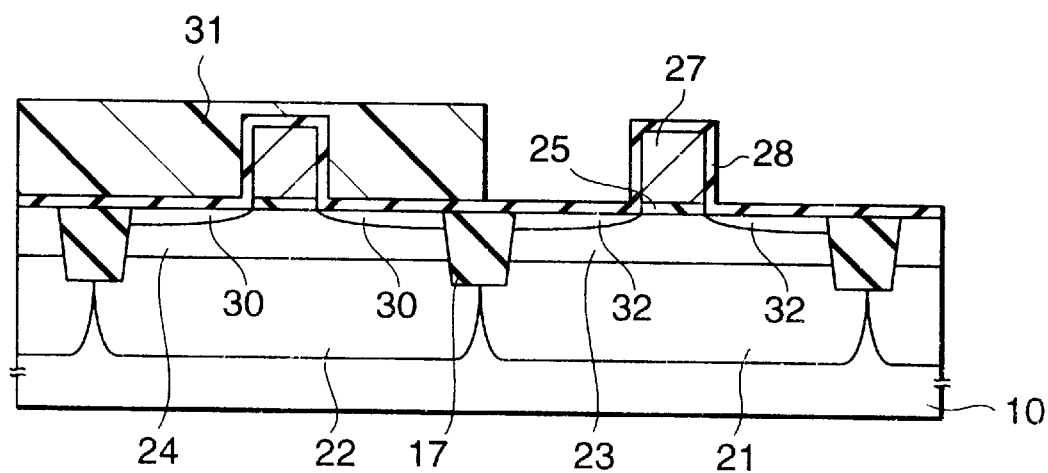
FIG. 13 is a section view showing a manufacturing step of the semiconductor device subsequent to that of FIG. 12.

Subsequently, as shown in FIG. 13, a patterned photoresist film 31 is selectively formed above the N well 22. Impurities are directed at the surface of the semiconductor substrate 10 using the photoresist film 31 as a mask, thus forming an N type extension region 32 in the surface of the semiconductor substrate 10 corresponding to the P well 21. Thereafter, the photoresist film 31 is removed.

Figure 14:
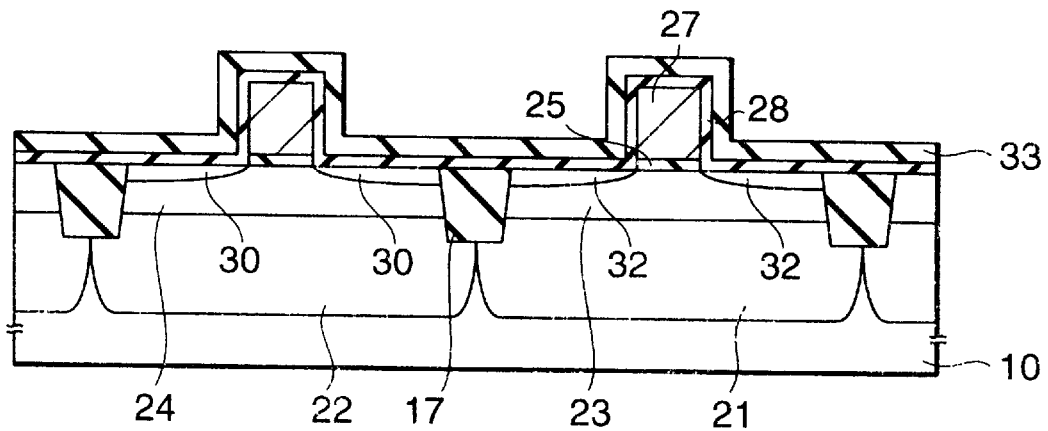
FIG. 14 is a section view showing a manufacturing step of the semiconductor device subsequent to that of FIG. 13.

A silicon nitride film 33 is formed on the entire surface of the resultant structure as shown in FIG. 14.

Figure 15:
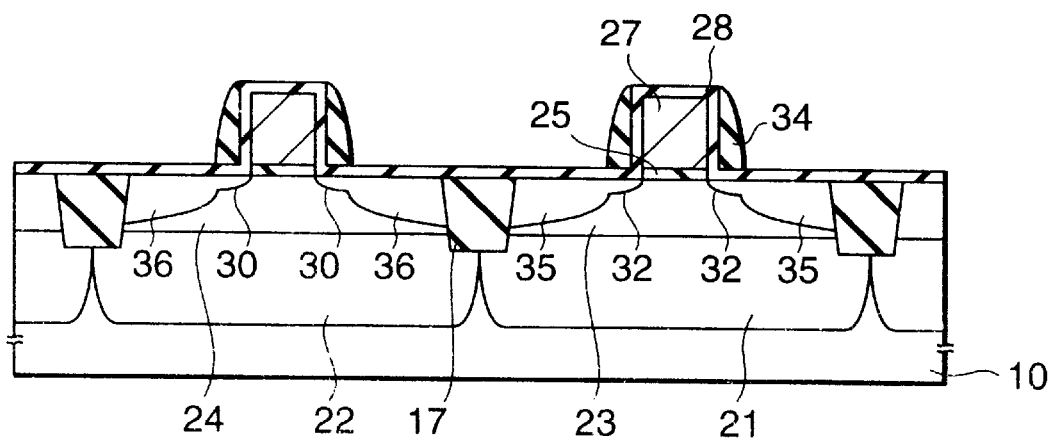
FIG. 15 is a section view showing a manufacturing step of the semiconductor device subsequent to that of FIG. 14.

The silicon nitride film 33 is selectively removed by RIE, and a gate side wall (spacer) 34 is formed on the side wall of the gate electrode 27, as shown in FIG. 15. Next, a patterned photoresist film (not shown) is selectively formed above the N well 22. Impurities are directed at the surface of the semiconductor substrate 10 using the photoresist film as a mask, thus forming an N-type diffusion layer 35 in the surface of the semiconductor substrate 10 corresponding to the P well 21. Thereafter, the photoresist film is removed. Next, a patterned photoresist film (not shown) is selectively formed above the P well 21. Impurities are directed at the surface of the semiconductor substrate 10 using the photoresist film as a mask, thus forming a P type diffusion layer 36 in the surface of the semiconductor substrate 10 corresponding to the N well 22. Thereafter, the photoresist film is removed.

The CMOS FET is formed in the above described manner, and thereafter formation of a LSI is completed after performing a silicide step and a metalization step, which are known.

A concentration distribution of nitrogen in the semiconductor device of the present invention will be described with reference to FIGS. 16 and 17. In the present invention, the high concentration region of nitrogen in the gate insulating film 25 is in contact with the surface of the semiconductor substrate 10. This is because it is possible to suppress oxidation of the semiconductor substrate 10 due to existence of a small quantity of nitrogen in the surface of the semiconductor substrate 10. Furthermore, silicon nitride shows generally a higher dielectric constant than that of silicon oxide. When the nitrogen content is too much, a dielectric constant of the gate oxide film becomes large, and a through current increases. Experiments show that if the content of nitrogen is about 10%, the through current of the MOS transistor can be suppressed.

Figure 16:
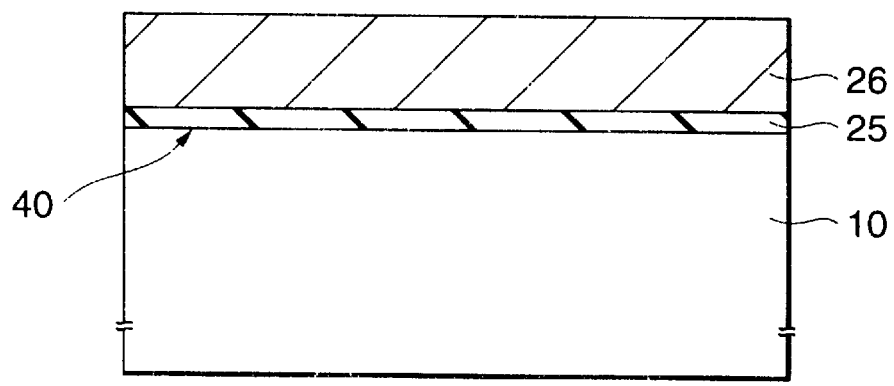
FIG. 16 is a section view showing a gate corner portion of the semiconductor device according to the present invention.
Figure 17:
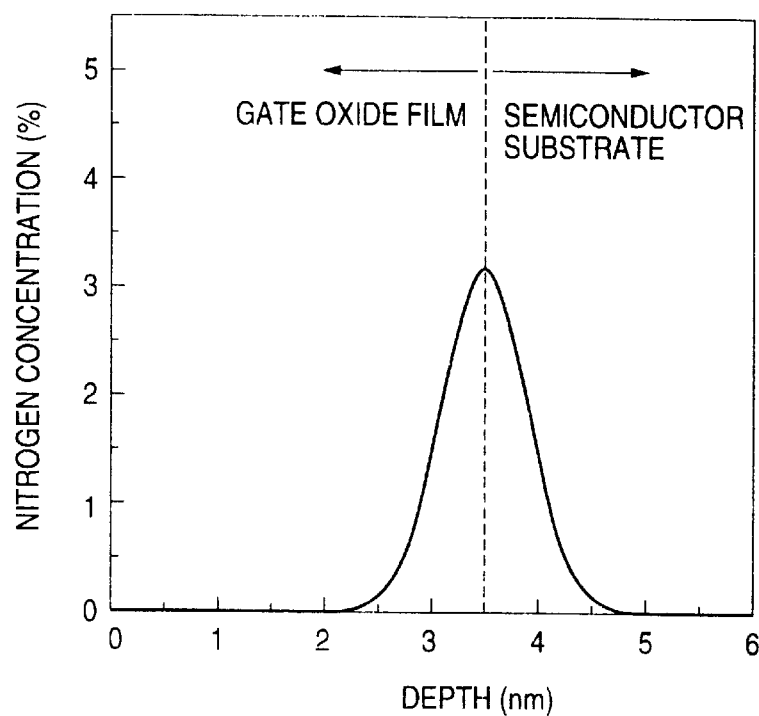
FIG. 17 is a diagram showing a relation between a nitrogen concentration and a depth extending from a gate oxide film into the semiconductor substrate.

In this embodiment, as shown in FIG. 16, the high concentration region of nitrogen is formed on the surface of the gate insulating film 25 closer to the semiconductor substrate 10. As shown in FIG. 17, a boundary portion between the surface of the semiconductor substrate 10 and the gate insulating film 25 shows the highest nitrogen concentration.

Figure 18:
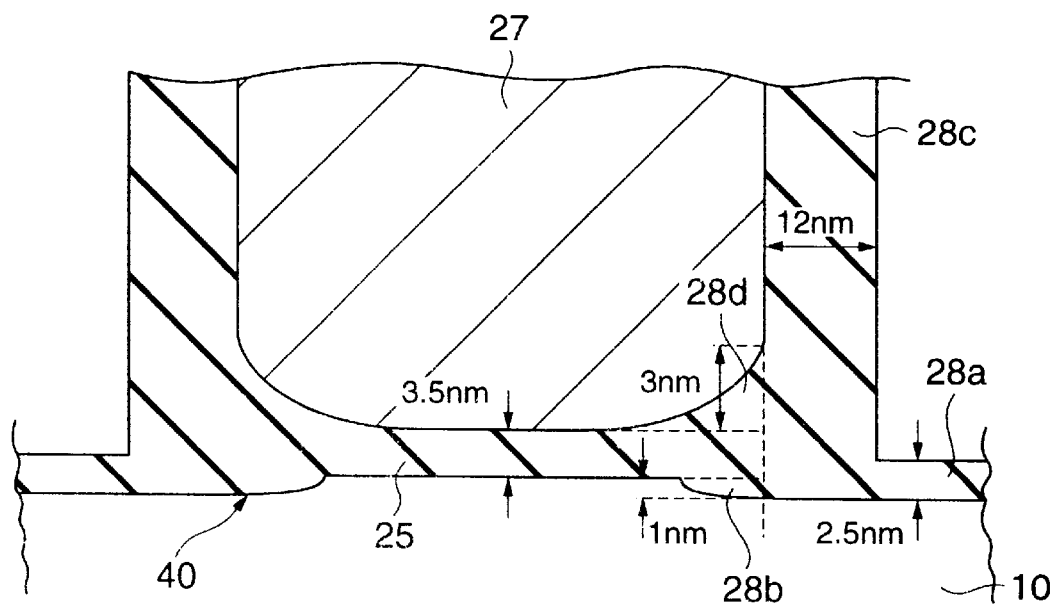
FIG. 18 is a section view showing a gate corner portion of the semiconductor device according to the present invention.

A section view of the semiconductor device according to the present invention is shown in FIG. 18 in detail. First, an oxide film 28a having a thickness of 2.5 nm is formed on a portion of the surface of the semiconductor substrate 10, which does not overlap vertically the polysilicon gate electrode 27, and an oxide film 28b having a thickness of 1 nm or less is formed on another portion of the surface of the semiconductor substrate 10, which overlaps vertically the polysilicon gate electrode 27. An oxide film 28c having a thickness of 12 nm is formed on the side surface of the polysilicon gate electrode 27, and an oxide film 28d having a thickness of 3 nm or more is formed on the corner portion of the polysilicon gate electrode 27, which overlaps vertically the gate insulating film 25. As described above, with reference to the gate insulating film 25 formed on the corner portion of the gate electrode 27, the thickness of the oxide film 28b is one third or less than the thickness of the oxide film 28d. When the gate oxide film does not contain nitrogen, the thickness of the oxide film 28b increases.

Figure 19:
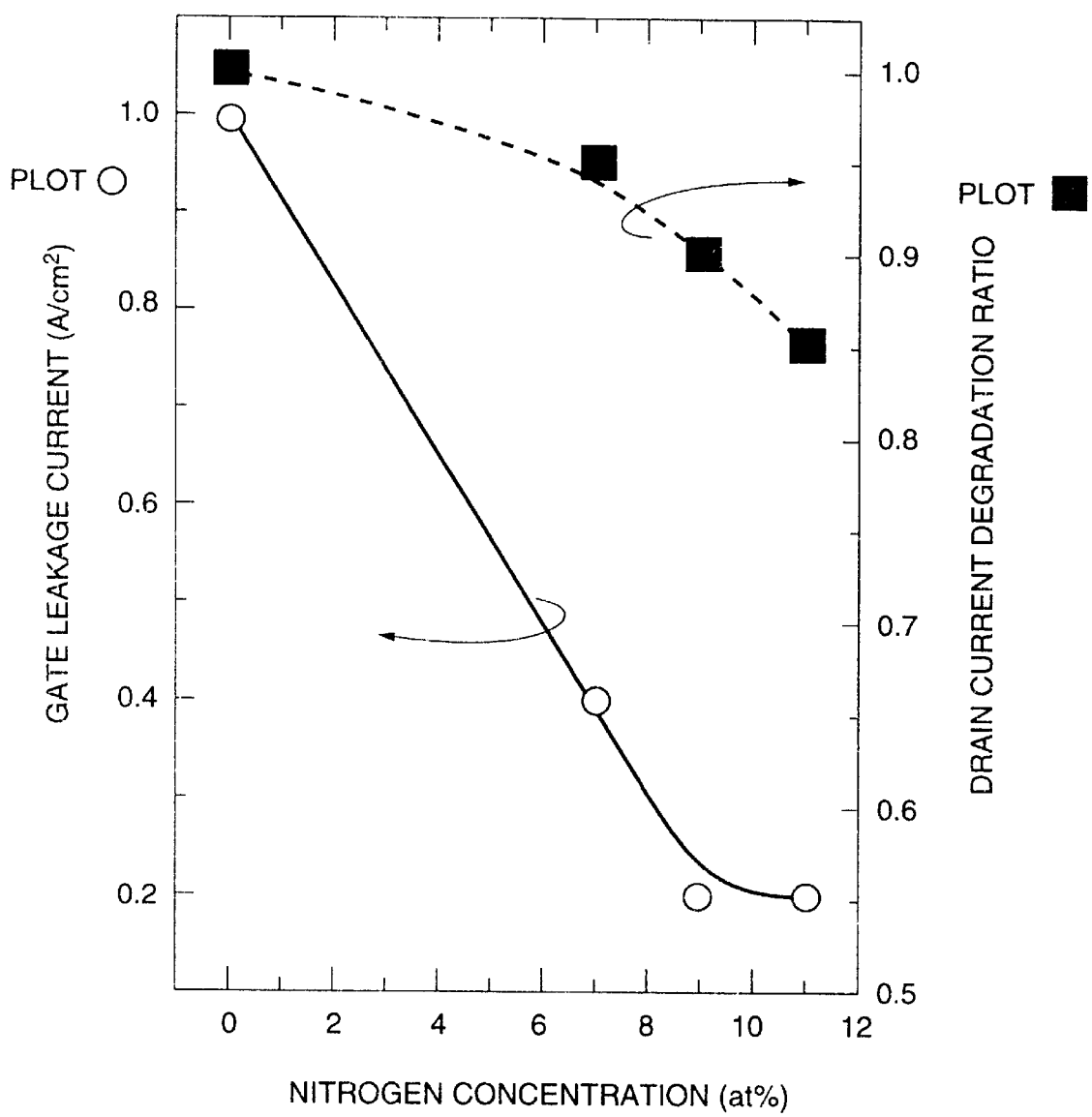
FIG. 19 is a diagram showing a correlation between a nitrogen concentration contained in a gate oxide film of the semiconductor device according to the present invention and performance of a MOS transistor.

FIG. 19 is a diagram showing a correlation between a nitrogen concentration contained in the gate insulating film and a performance of the MOS transistor in the semiconductor device of the present invention. In FIG. 19, the abscissa shows a concentration (%) of nitrogen contained in the gate insulating film, the ordinate shows a gate leakage current indicated by ○ and a drain current degradation ratio indicated by ■. The drain current degradation ratio is a ratio in which the drain current is set to 1 when the nitrogen concentration is 0%.

As the nitrogen concentration increases, the leakage current reduces. However, the drain current reduces. Since the drain current is proportional to a driving force, a driving force of the MOS transistor reduces. Although the leakage current should be small, too large an increase in the nitrogen concentration causes the MOS transistor to be incapable of operating. When it is supposed that a limitation of the drain current degradation is 10%, the concentration of nitrogen contained in the gate oxide film should be about 2% to 10%.

According to the present invention, as shown in FIG. 2-B, although the oxidation in the side wall of the gate electrode 27 proceeds in forming the post oxide film, the oxidation toward the semiconductor substrate 10 can be controlled because of the existence of the high concentration region 40 containing nitrogen in the surface of the semiconductor substrate 10. Accordingly, an increase in the thickness of the, oxide film in the corner portion of the gate electrode 27 can be controlled to approximately half compared to the prior art. In other words, leakage of lines of electric force due to the increase of the thickness of the oxide film in the corner portion of the gate electrode 27 can be controlled. Accordingly, lowering of a gate voltage can be prevented and controllability of the transistor can be improved. Furthermore, when the extension diffusion layer of the source/drain electrode is formed, the gate insulating film is used as the protection oxide film in ion implantation. Since the increase in the thickness of the gate insulating film is controlled, it is possible to prevent the reduction in the dose of impurities implanted into the semiconductor substrate. Therefore, fly distances of ions can be shortened compared to the prior art, so that the wide dispersions of the ions implanted can be controlled. Thus, it is possible to form the precise impurity concentration profile.

In the corner portion of the gate electrode 27, the radius of curvature of the corner portion of the gate electrode 27 becomes large due to the oxidation, the electric field concentration in the corner portion of the gate electrode 27 can be relaxed. Note that the method for oxidizing the gate electrode is not limited to annealing, and the gate electrode may also be oxidized by RTO (Rapid Thermal Oxidation) performed under conditions that a temperature is, for example, 1053° C. and a processing time is, for example, 50 seconds.

As described above, according to the present invention, the semiconductor device and the manufacturing method of the same can be provided, which are capable of controlling the occurrence of the leakage current at the corner portion of the gate electrode and the reduction in the dose of the impurities implanted into the semiconductor substrate during ion implantation in forming the source/drain diffusion layer.

While there has been illustrated and described what are presently considered to be preferred embodiments of the present invention, it will be understood by those skilled in the art that various changes and modifications may be made, and equivalents may be substituted for devices thereof without departing from the true scope of the invention. In addition, many modifications may be made to adapt a particular situation or material to the teaching of the present invention without departing from the central scope thereof. Therefore, it is intended that this invention not be limited to the particular embodiment disclosed as the best mode contemplated for carrying out this invention, but that the invention includes all embodiments falling within the scope of the appended claims.

What is claimed is:

1. A semiconductor device, comprising:

a semiconductor substrate;

a gate insulating film on said semiconductor substrate, the gate insulating film containing nitrogen;

a gate electrode on said gate insulating film; and an oxide film on a surface of said gate electrode and said semiconductor substrate, wherein said gate insulating film has a first portion under a center portion of said gate electrode and a second portion under an edge of said gate electrode, said second portion being thicker than said first portion, a first surface and a second surface of said first portion defining first and second parallel lines that intersect said second portion, said first parallel line being between said first portion and said substrate, said second parallel line being between said first portion and said gate electrode, a thickness of said second portion between said first parallel line and said substrate being one third or less than a thickness of said second portion between said second parallel line and said gate electrode, wherein said gate insulating film is an oxide film containing nitrogen at a concentration ranging from about 2 to 10%.

2. A semiconductor device, comprising:

a semiconductor substrate;

a gate insulating film on said semiconductor substrate, the gate insulating film containing nitrogen;

a gate electrode on said gate insulating film;

an oxide film on a surface of said gate electrode and said semiconductor substrate; and a gate side wall film on a surface of said oxide film, wherein said gate insulating film located just under said gate electrode is an oxide film containing at a concentration ranging from about 2 to 10%.

3. A semiconductor device, comprising:

a semiconductor substrate;

a gate insulating film on the semiconductor substrate;

a gate electrode on the gate insulating film; and an oxide film on a side wall of the gate electrode, wherein the gate insulating film has a first region under a center portion of the gate electrode and a second region under an edge of the gate electrode, wherein the second region of the gate insulating film has a first protrusion protruded toward the gate electrode, and a second protrusion protruded toward the semiconductor substrate, wherein a distance between a height of an upper surface of the first region of the gate insulating film and a height of a peak of the first protrusion is bigger than a distance between a height of a lower surface of the first region of the gate insulating film and a height of a peak of the second protrusion, wherein the gate insulating film contains nitrogen, and wherein a concentration of the nitrogen ranges from about 2 to 10%.

4. A semiconductor device, comprising:

a semiconductor substrate;

a gate insulating film on the semiconductor substrate;

a gate electrode on the gate insulating film; and an oxide film on a side wall of the gate electrode, wherein the gate insulating film has a first region under a center portion of the gate electrode and a second region under an edge of the gate electrode, wherein the second region of the gate insulating film has a first protrusion protruded toward the gate electrode, and a second protrusion protruded toward the semiconductor substrate, wherein a distance between a height of an upper surface of the first region of the gate insulating film and a height of a peak of the first protrusion is bigger than a distance between a height of a lower surface of the first region of the gate insulating film and a height of a peak of the second protrusion, wherein the gate insulating film contains nitrogen, and wherein the concentration of the nitrogen at the upper surface of the first region and the concentration of the nitrogen at the upper surface of the second region are substantially same concentration.

5. The semiconductor device according to claim 3, wherein the gate insulating film has a portion of a maximum concentration of the nitrogen, the portion being located near an interface between the gate insulating film and the semiconductor substrate.

6. The semiconductor device according to claim 4, wherein the gate insulating film has a portion of a maximum concentration of the nitrogen, the portion being located near an interface between the gate insulating film and the semiconductor substrate.

7. The semiconductor device according to claim 3, wherein a distance between the height of the lower surface of the first region of the gate insulating film and the height of the peak. of the second protrusion is not greater than one third of a distance between the height of the upper surface of the first region of the gate insulating film and the height of the peak of the first protrusion.

8. The semiconductor device according to claim 4, wherein a distance between the height of the lower surface of the first region of the gate insulating film and the height of the peak of the second protrusion is not greater than one third of a distance between the height of the upper surface of the first region of the gate insulating film and the height of the peak of the first protrusion.

* * * * *